United States Patent
Forsyth et al.

(10) Patent No.: US 7,565,980 B2
(45) Date of Patent: *Jul. 28, 2009

(54) WAFER BOX WITH RADIALLY PIVOTING LATCH ELEMENTS

(75) Inventors: Valoris L. Forsyth, Lewisville, TX (US); Jim Gardiner, Woodburn, OR (US); Berry Brown, Evergreen, CO (US)

(73) Assignee: Illinois Tool Works Inc., Glenview, IL (US)

( * ) Notice: Subject to any disclaimer, the term of this patent is extended or adjusted under 35 U.S.C. 154(b) by 477 days.

This patent is subject to a terminal disclaimer.

(21) Appl. No.: 10/507,471

(22) PCT Filed: May 11, 2004

(86) PCT No.: PCT/US2004/014659

§ 371 (c)(1), (2), (4) Date: Apr. 5, 2006

(87) PCT Pub. No.: WO2005/001890

PCT Pub. Date: Jan. 6, 2005

(65) Prior Publication Data

US 2006/0180499 A1    Aug. 17, 2006

Related U.S. Application Data

(63) Continuation-in-part of application No. 10/787,489, filed on Feb. 25, 2004, now Pat. No. 6,988,621.

(60) Provisional application No. 60/479,086, filed on Jun. 17, 2003.

(51) Int. Cl.
    *B65D 85/00* (2006.01)

(52) U.S. Cl. .................................... 206/710

(58) Field of Classification Search ......... 206/710–712, 206/454, 445, 449, 453, 832, 455, 456, 493; 220/324, 326, 8; 211/41.12, 42.18
See application file for complete search history.

(56) References Cited

U.S. PATENT DOCUMENTS

| | | | | |
|---|---|---|---|---|
| 5,366,079 | A | * 11/1994 | Lin et al. | ...... 206/710 |
| 5,553,711 | A | * 9/1996 | Lin et al. | ...... 206/710 |
| 5,611,448 | A | * 3/1997 | Chen | ...... 220/4.27 |
| 5,724,748 | A | * 3/1998 | Brooks et al. | ...... 34/90 |
| 5,725,100 | A | * 3/1998 | Yamada | ...... 206/710 |
| 6,003,674 | A |   12/1999 | Brooks | |
| 6,193,068 | B1 | * 2/2001 | Lewis et al. | ...... 206/710 |
| 6,193,090 | B1 | * 2/2001 | Connors et al. | ...... 220/4.24 |

(Continued)

*Primary Examiner*—Luan K Bui
*Assistant Examiner*—Chun Cheung
(74) *Attorney, Agent, or Firm*—Day Pitney LLP

(57) ABSTRACT

The semiconductor wafer containment device or wafer box includes a base with a planar floor and a double concentric cylindrical wall structure arising therefrom. The double concentric cylindrical wall structure includes slots through which latch elements pivot radially. The latch elements include an inward padded spacer element. The latch elements pivot between an outward position wherein the padded spacer elements are relatively away from the wafer containment space and an inward upright position wherein the padded spacer elements impinge into the wafer containment space and are urged against the semiconductor wafers therein. Ramps on the lid capture the latch elements in the outward position and urge the latch elements to pivot to the inward upright position and be detent engaged in this position by slots formed on the lid.

20 Claims, 9 Drawing Sheets

U.S. PATENT DOCUMENTS 6,286,684 B1 *  9/2001  Brooks et al. ............... 206/710
6,341,695 B1 *  1/2002  Lewis et al. ................. 206/710
6,550,619 B2 *  4/2003  Bores et al. ................. 206/710
6,564,946 B2 *  5/2003  Lewis et al. ................. 206/710
6,915,906 B2 *  7/2005  Pylant et al. ................ 206/710
6,988,620 B2 *  1/2006  Haggard et al. ............. 206/710
6,988,621 B2 *  1/2006  Forsyth ...................... 206/710
7,225,929 B2 *  6/2007  Forsyth ...................... 206/710

* cited by examiner

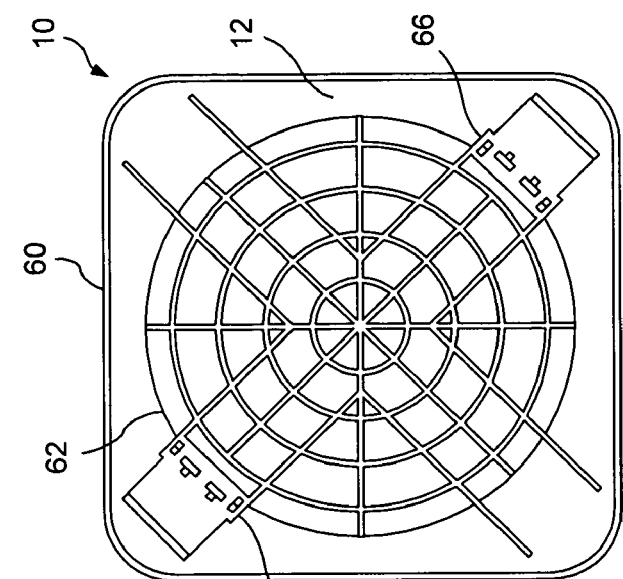
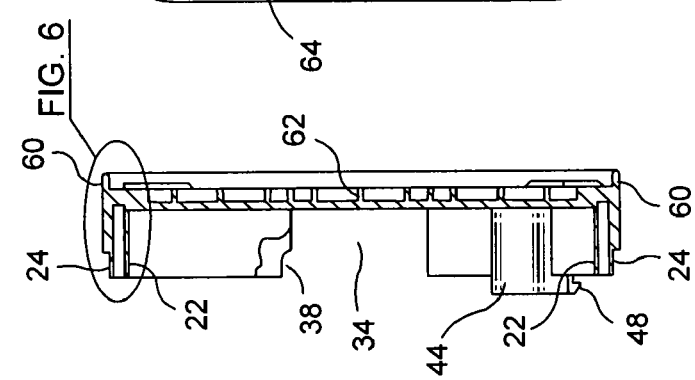
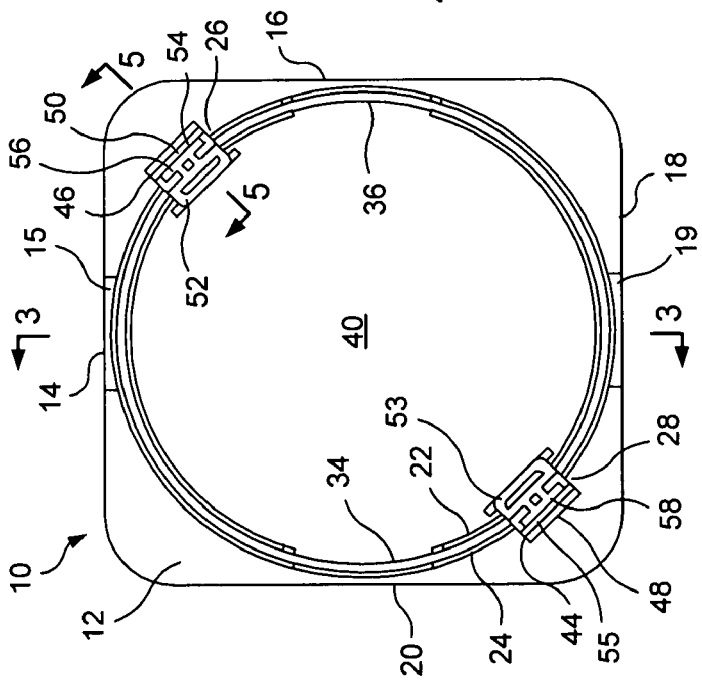
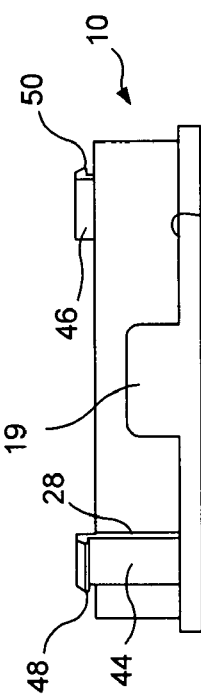

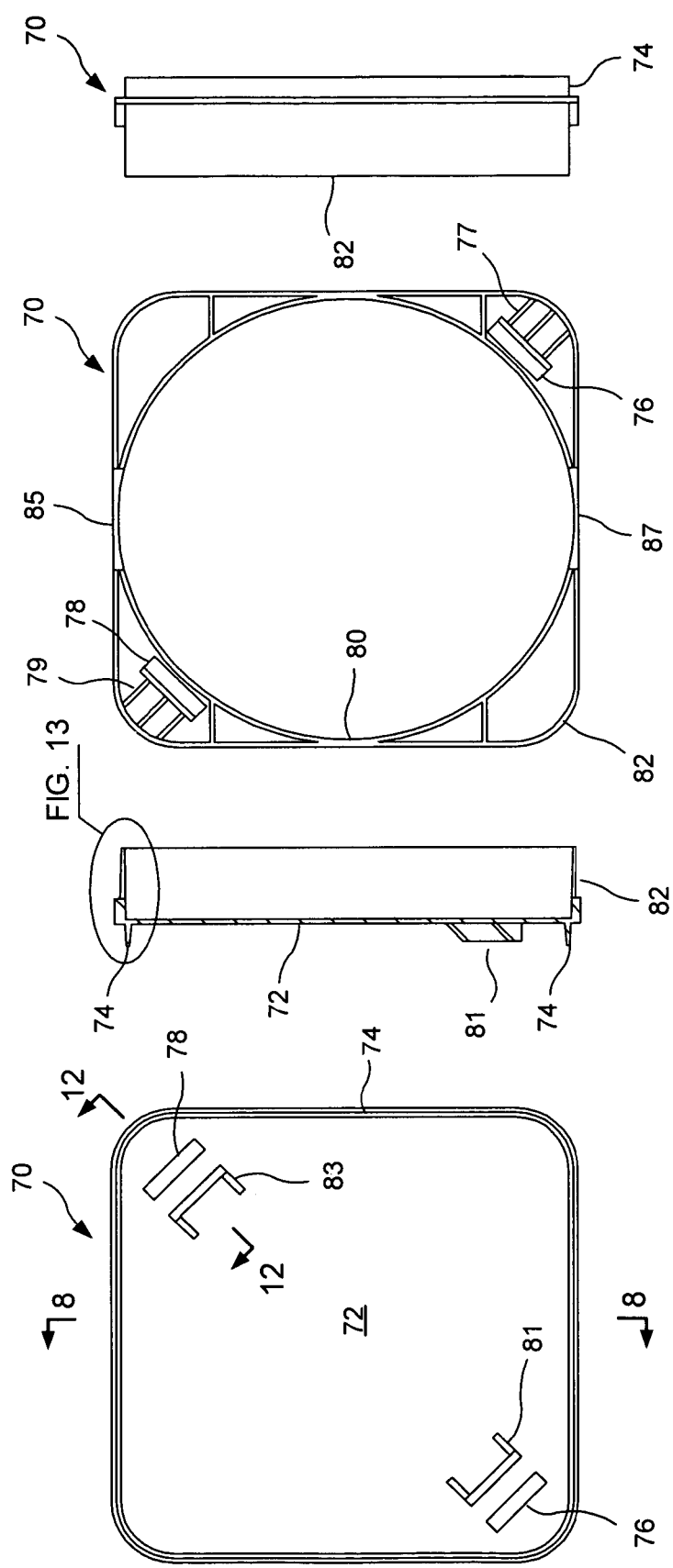

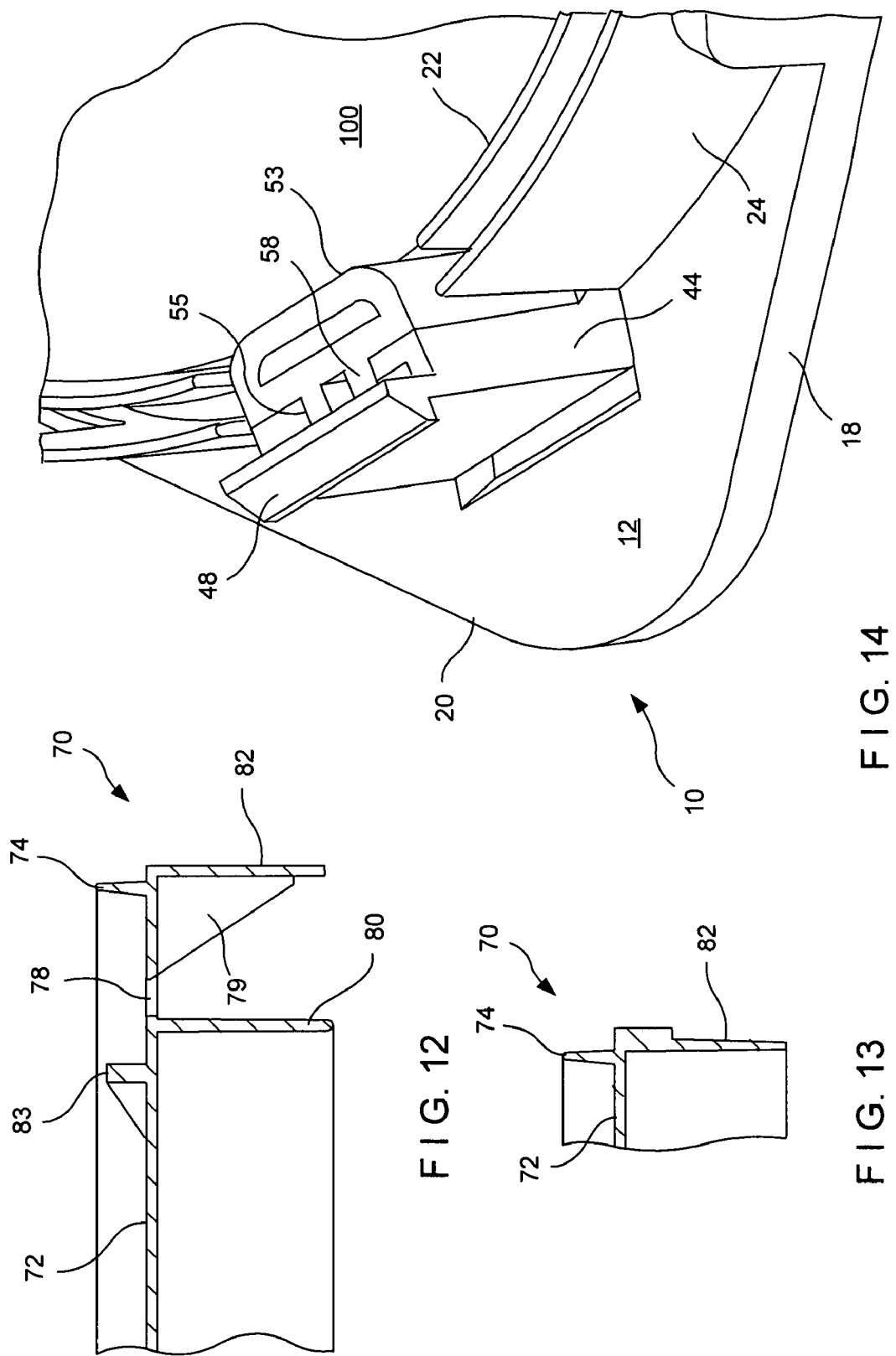

WAFER BOX WITH RADIALLY PIVOTING LATCH ELEMENTS

This application is a 371 of PCT/US04/14659 filed on May 11, 2004 and a CIP of application Ser. No. 10/787,489 filed on Feb. 25, 2004 now U.S. Pat. No. 6,988,621, which claims benefit of provisional application No. 60/479,086 filed on Jun. 17, 2003.

BACKGROUND OF THE INVENTION

1. Field of the Invention

The present invention relates to a containment device or wafer box for semiconductor wafers. More particularly, this containment device has latch elements which pivot radially through slots in a cylindrical wall. The latch elements include spacer elements on the inside surface to engage semiconductor wafers within the cylindrical wall when the latch elements are in their upright position, detent engaged with the lid element. When the latch elements are not detent engaged with the lid, the latch elements along with the spacer elements are free to pivot radially outwardly to provide free access to the semiconductor wafers.

2. Description of the Prior Art

The prior art contains a variety of designs for the containment and transport of semiconductor wafers. These designs must provide both electrostatic and mechanical protection for the wafers contained therein. Preferably, such containment devices should be easily adaptable to various automated apparatus which load or unload the semiconductor wafers. Such containment devices should have a simple design which is reliable and economical to mass produce.

Examples of some prior art are U.S. Pat. No. 6,193,068 entitled "Containment Device for Retaining Semiconductor Wafers" issued on Feb. 27, 2001 to Lewis et al.; U.S. Pat. No. 6,286,684 entitled "Protective System for Integrated Circuit (IC) Wafers Retained Within Containers Designed for Storage and Shipment" issued on Sep. 11, 2001 to Brooks et al.; U.S. Pat. No. 6,003,674 entitled "Method and Apparatus for Packing Contaminant-Sensitive Articles and Resulting Package" issued on Dec. 21, 1999 to Brooks; and U.S. Pat. No. 5,724,748 entitled "Apparatus for Packaging Contaminant-Sensitive Articles and Resulting Package" issued on Mar. 10, 1998 to Brooks et al.

OBJECTS AND SUMMARY OF THE INVENTION

In order to attain the above and other objects, the semiconductor wafer containment device is provided with at least one cylindrical wall which forms a wafer containment space. The cylindrical wall includes slots through which latch elements pivot radially. The latch elements include spacer elements on the inward surface thereof. When the latch elements are detent engaged by the lid, the latch elements are in an upright position with the spacer elements extending into the wafer containment space formed within the cylindrical wall. The spacer elements are thereby urged against the semiconductor wafers in the wafer containment space. When the latch elements are free of engagement with the lid, the latch elements are free to pivot radially outwardly to release engagement with the semiconductor wafers to allow the semiconductor wafers to be removed by a manual or automated process for further processing. Typically, the spacer elements on the interior of the latch elements are formed of somewhat soft or spongy material so as to engage the semiconductor wafers without damaging the wafers.

BRIEF DESCRIPTION OF THE DRAWINGS

Further objects and advantages will become apparent from the following description and from the accompanying drawings, wherein:

FIG. 1 is a top plan view of the base of the semiconductor wafer containment device of the present invention.

FIG. 2 is a side plan view of the base of the semiconductor wafer containment device of the present invention.

FIG. 3 is a cross-sectional view along plane 3-3 of FIG. 1.

FIG. 4 is a bottom plan view of the base of the base of the semiconductor wafer containment device of the present invention.

FIG. 7 is a top plan view of the lid of the semiconductor wafer containment device of the present invention.

FIG. 8 is a cross-sectional view along plane 8-8 of FIG. 7.

FIG. 9 is a bottom plan view of the lid of FIG. 7.

FIG. 10 is a front plan view of the lid of FIG. 7.

FIG. 11 is a side plan view of the lid of FIG. 7.

FIG. 12 is a cross-sectional view along plane 12-12 of FIG. 7.

FIG. 13 is a cross-sectional view further detailing a portion of FIG. 8.

FIG. 14 is a perspective view of the pivoting latch element of the present invention, in an upright position so that the spacer element engages the semiconductor wafers.

DETAILED DESCRIPTION OF THE PREFERRED EMBODIMENT

Figure 17:
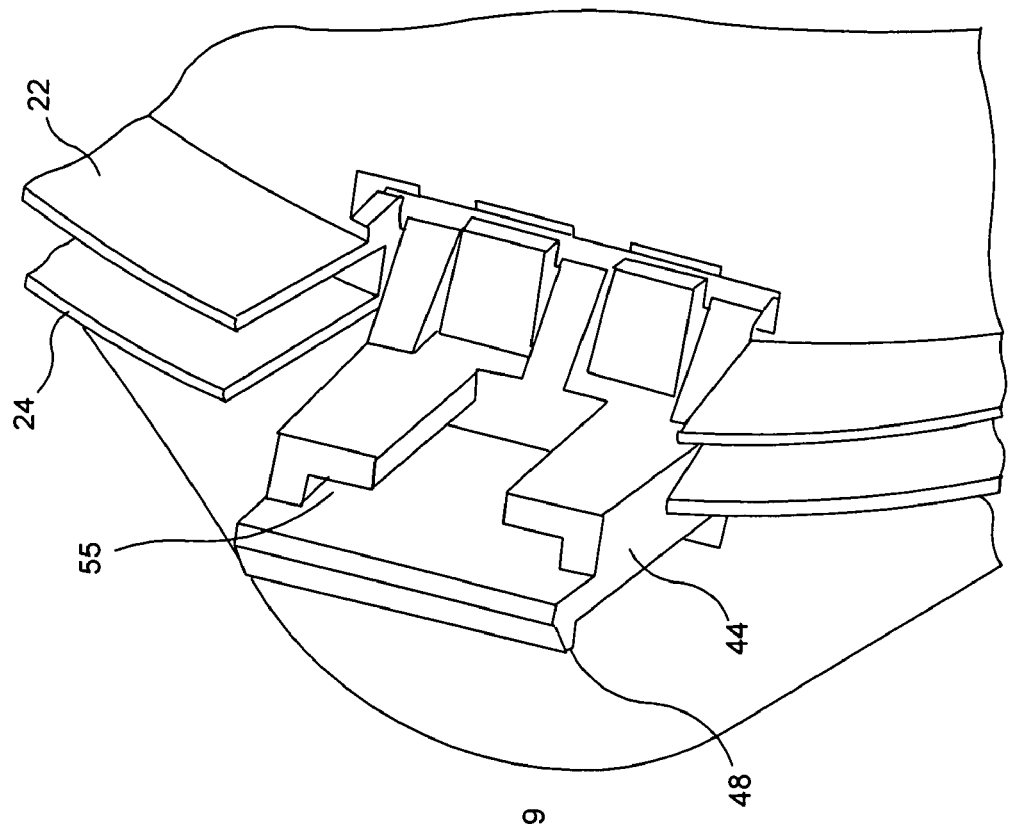
FIG. 17 is a perspective view of the pivoting latch element of the present invention, with the spacer element removed thereby showing the pivoting mechanism.
Figure 16:
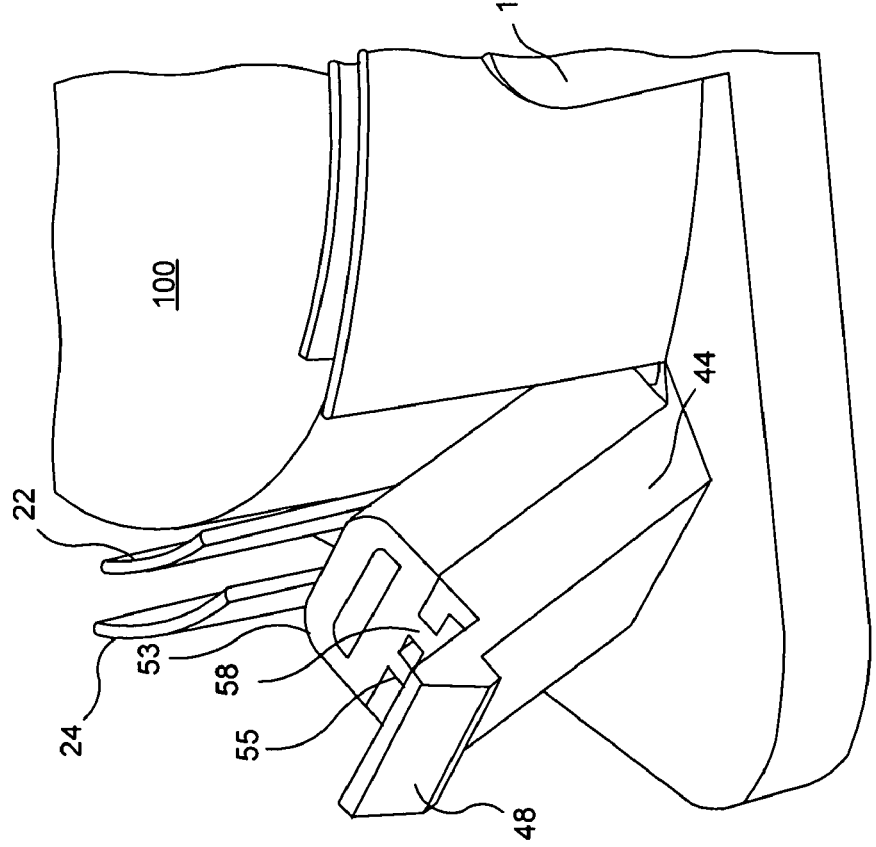
FIG. 16 is a perspective view of the pivoting latch element of the present invention, in an outwardly pivoted position so that the spacer element is substantially free of engagement with the semiconductor wafers.
Figure 19:
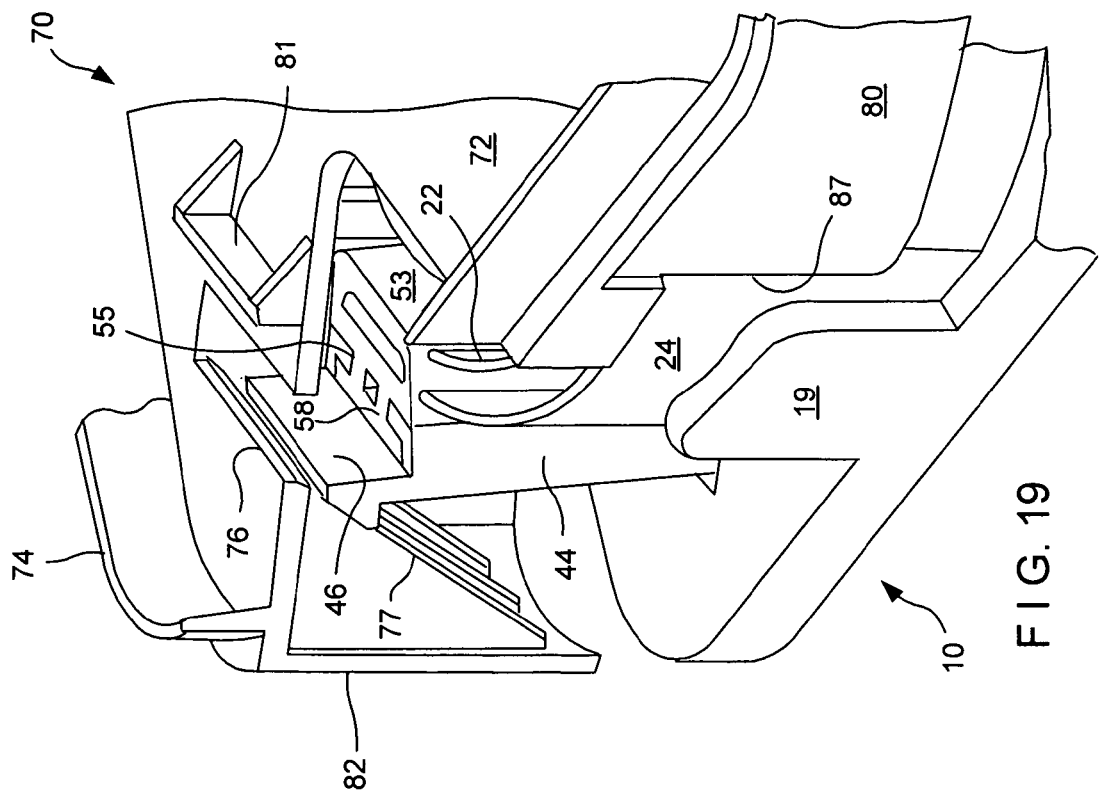
FIG. 19 is a perspective, partially cut-away, view of the lid of the semiconductor wafer containment device being brought further into engagement with the base, whereby the pivoting latch element is almost in its upright position, and approaching engagement with the slot in the lid.
Figure 18:
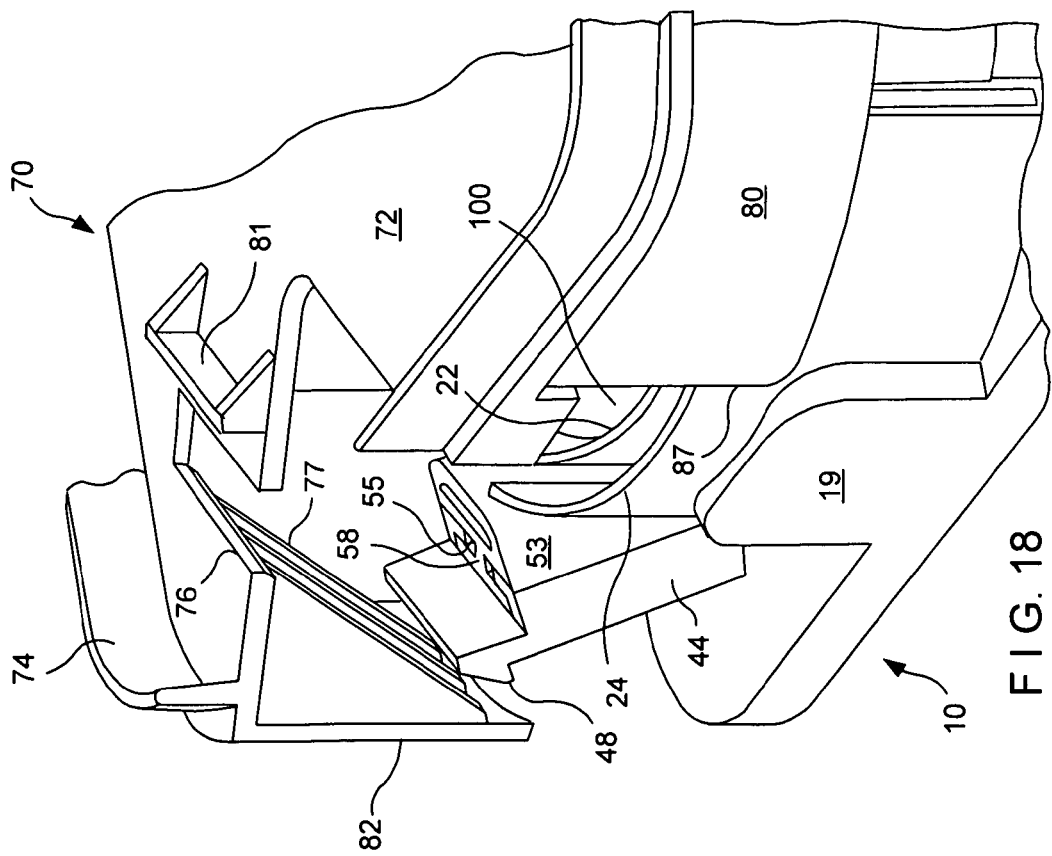
FIG. 18 is a perspective, partially cut-away, view of the lid of the semiconductor wafer containment device being brought into engagement with the base, whereby a ramp in the interior of the lid urges the pivoting latch element from an outwardly pivoted position toward the upright position as the lid is brought into engagement with the base.

Referring now to the drawings in detail wherein like numerals refer to like elements throughout the several views, one sees that FIG. 1 is a top plan view of the base 10 of the semiconductor wafer containment device or wafer box of the present invention. Base 10 includes a generally planar square floor 12 formed from sides 14, 16, 18, 20. Inner and outer concentric cylindrical walls 22, 24 rise from the planar floor 12. Male aligning elements 15, 19 are formed at central locations on sides 14, 18 outwardly from outer concentric cylindrical wall 24. Inner and outer concentric cylindrical walls 22, 24 include slots 26, 28 at opposed corners and aligned gaps forming openings 34, 36 which are opposed by 180° from each other. As shown in the fragmentary portion of FIG. 3, the portion of inner concentric cylindrical wall 22 immediately adjacent to openings 34, 36 includes partial notch 38. A wafer containment space 40 is formed within inner concentric cylindrical wall 22. Wafer containment space 40 may be adapted to an eight inch diameter wafer, although a range of other sizes is certainly possible. Pivoting latch elements 44, 46 terminating in inverted ledges 48, 50 are journaled from diagonally opposite corners of floor 12 and pivot radially through slots 26, 28. Pivoting latch elements 44, 46 have extruded padded spacer elements 52, 53 on the interior surface thereof for the engagement of the semiconductor wafers 100 (see FIGS. 14, 16 and 18-21). As shown in FIGS. 16 and 17, pivoting latch elements 44, 46 include T-shaped grooves 54, 55 for receiving complementary T-shaped flanges 56, 58 on the exterior of extruded padded elements 52, 53 (see FIG. 22).

Extruded padded spacer elements 52, 53 need to be soft to cushion the semiconductor wafers 100 but firm enough to prevent movement as extruded padded spacer elements 52, 53 act like a spring gently pushing on the stack of semiconductor wafers 100. A typical material for the extruded padded spacer elements 52, 53 would be Kraton but one skilled in the art would recognize a range of equivalent materials after study of this disclosure.

FIG. 4 shows the bottom plan view of base 10, including peripheral foot structure 60 which extends around the periphery of floor 12 in order to provide an offset between floor 12 and the surface (not shown) upon which base 10 is resting. Additionally, lattice work 62 is formed on the bottom of floor 12. Furthermore, FIG. 4 shows the underside of the pivot axes 64, 66 of pivoting latch elements 44, 46.

Figure 24:
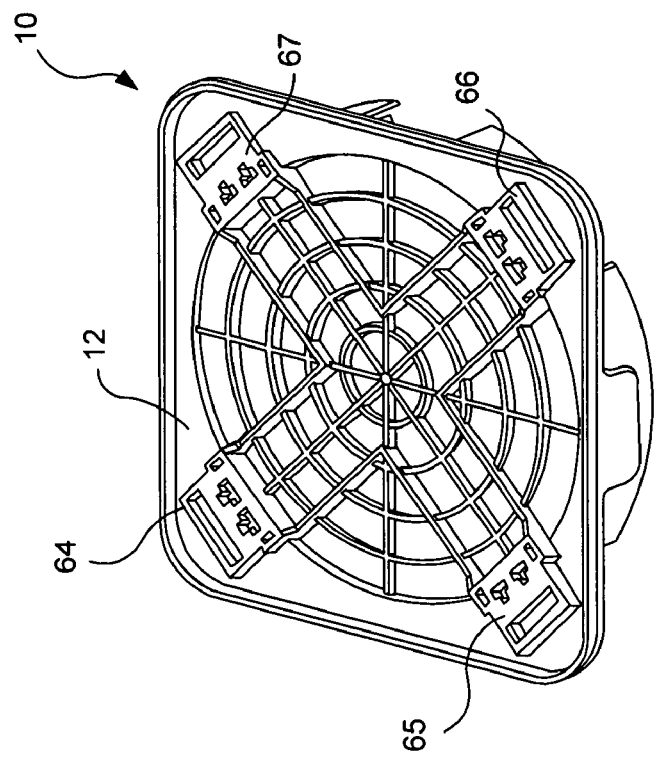
FIG. 24 bottom perspective view of the base of an alternative embodiment of the semiconductor wafer containment device of the present invention, configured for use with four pivoting latch elements.
Figure 23:
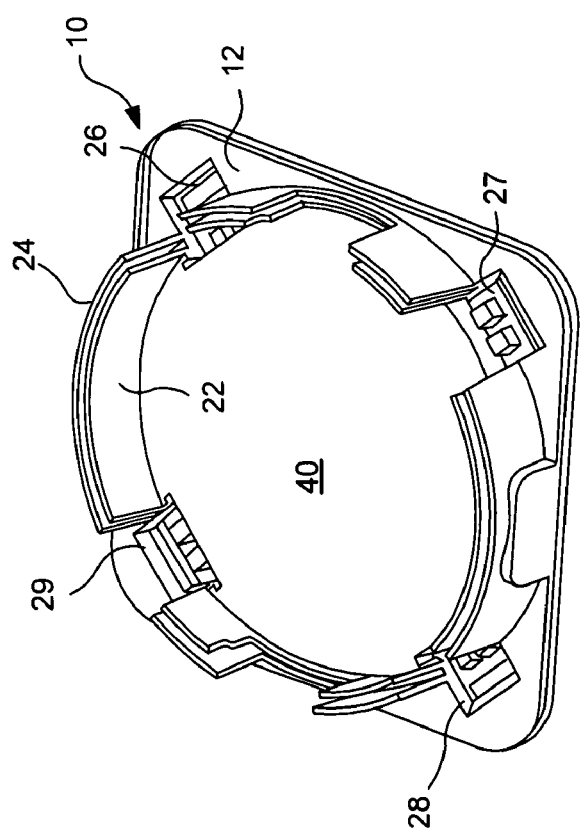
FIG. 23 is a top perspective view of the base of an alternative embodiment of the semiconductor wafer containment device of the present invention, configured for use with four pivoting latch elements.

FIGS. 23 and 24 show an alternative embodiment of base 10, with four slots 26, 27, 28, 29 with four pivot axes 64, 65, 66, 67 for receiving pivoting latch elements. Such a configuration is typically used for larger wafer sizes.

Figure 5:
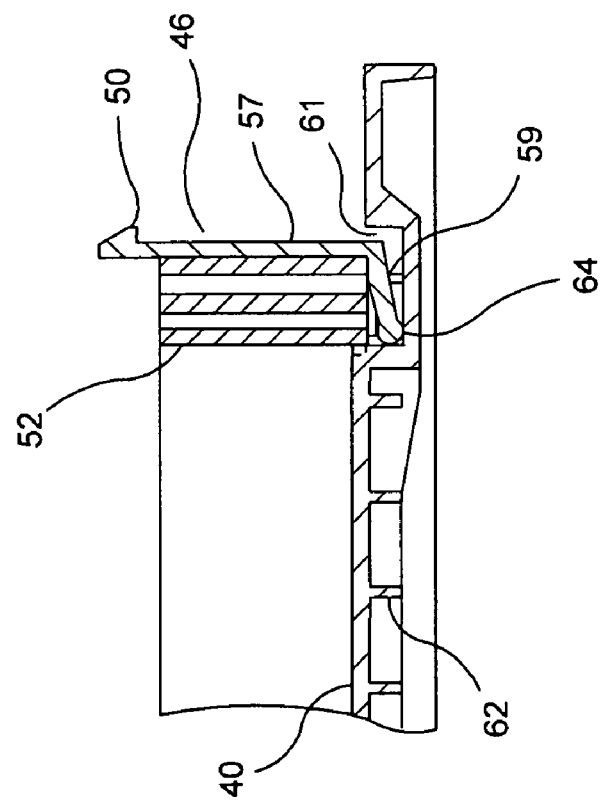
FIG. 5 is a cross-sectional view alone plane 5-5 of FIG. 1.
Figure 15:
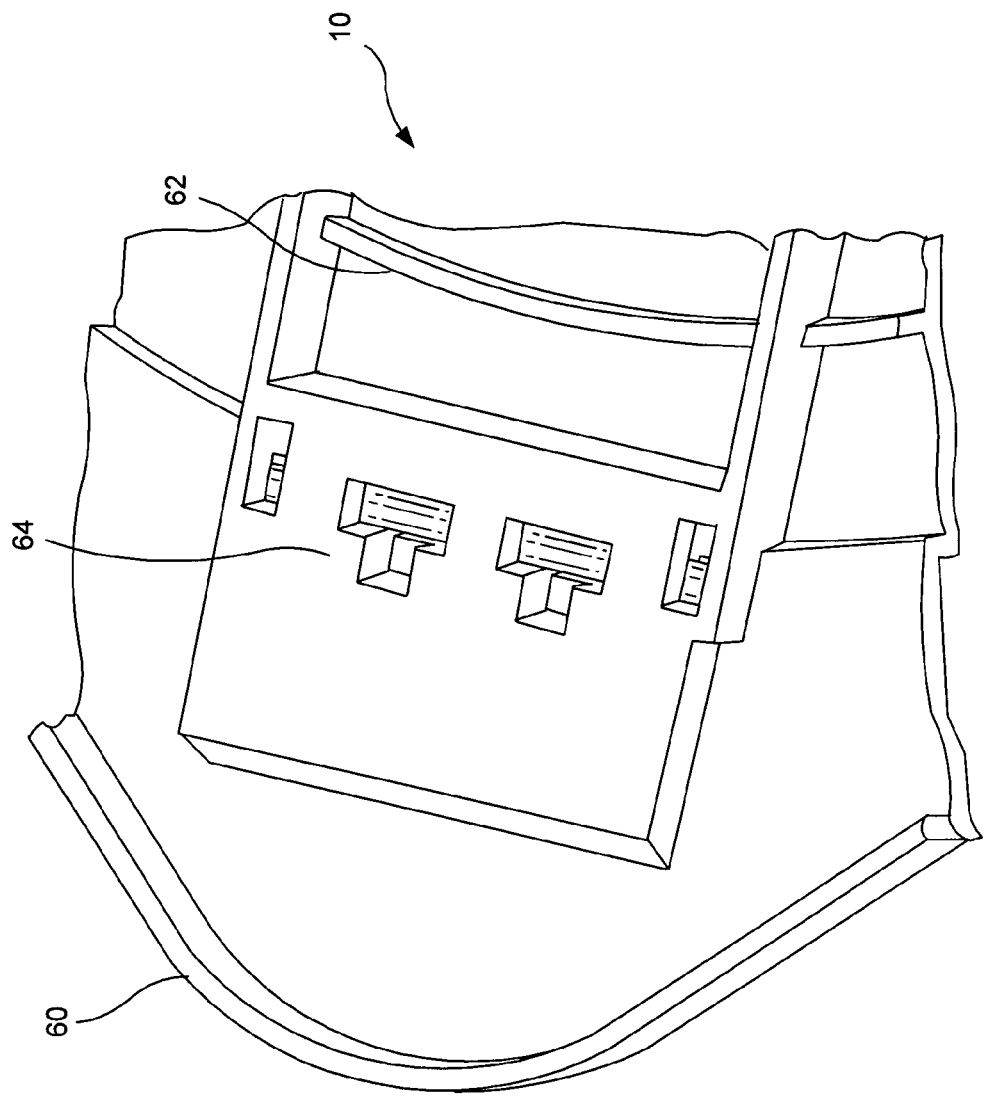
FIG. 15 is a perspective view of a portion of the underside of the base of the present invention, showing the pivoting mechanism of the pivoting latch element

FIG. 5 shows cross-sectional detail of the pivot axis 64 (which likewise applies to pivot axis 66) of pivoting latch element 44. Pivoting latch element 44 includes major arm 57 which is attached to minor arm 59. Minor arm 59 is seated Within pocket 61 of base 10 and terminates at pivot axis 64. Major arm 57 is attached to minor arm 59 at an obtuse angle slightly greater than 90°. This obtuse angle, along with other dimensions, determines or limits the outward angle at which major arm 57 of pivoting latch element 44 can extend when minor arm 59 rests on the floor of pocket 61 thereby resulting in pivoting latch element 44 being in its outward position such as shown in FIGS. 14, 16, 18 and 21. The limiting of the outward angle or outward position is necessary to ensure that the structures of the lid 70, as described hereinafter, can capture the pivoting latch elements 44, 46 in the outward position and urge them into the upright detent position.

Figure 6:
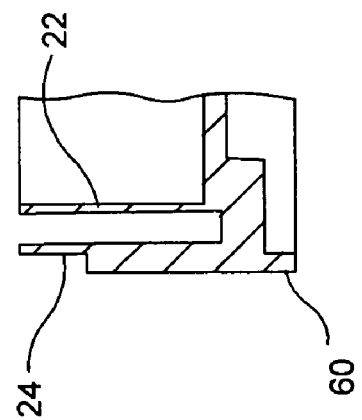
FIG. 6 is a cross-sectional view further detailing a portion of FIG. 3.

FIG. 6 shows some detail of inner and outer concentric cylindrical walls 22, 24.

FIGS. 7-10 show the lid 70 of the semiconductor wafer containment device or wafer box of the present invention. Lid 70 includes top planar square surface 72 surrounded by peripheral upwardly extending ledge 74 and bounded by generally square outer skirt wall 82. Cylindrical wall 80 is formed inwardly of outer skirt wall 82. Slots 76, 78 are formed on opposite corners of top planar square surface 72. Slots are formed at each corner for a lid 70 adaptable to the embodiment of the base 10 shown in FIGS. 23 and 24. Ramps 77, 79 are formed between slots 76, 78 and outer skit wall 82. In reaching the installed position of FIG. 20, ramps 77, 79 capture the pivoting latch elements 44, 46 (see FIG. 18) from a radially outward pivoted position (see FIG. 21) and urge (see FIG. 19) pivoting latch elements 44, 46 into an upright configuration so as to be received by slots 76, 78 to form a detent configuration (see FIG. 20), thereby urging extruded padded spacer elements 52, 53 to impinge against semiconductor wafers 100 in wafer containment space 40.

Finger gripping elements 81, 83 are formed radially inward from slots 76, 78 to allow a user to manually urge pivoting latch elements 44, 46 inwardly to release from slots 76, 78 when the lid 70 is to be removed. Outer cylindrical wall 80 is formed on the lower side of top planar square surface 72. Outer cylindrical wall 80 further includes female aligning elements 85, 87 which are oriented 180° apart. In the installed position, outer cylindrical wall 80 is immediately outwardly concentrically adjacent from outer concentric cylindrical wall 24 and female aligning elements 85, 87 are engaged with male aligning elements 15, 19.

Figure 21:
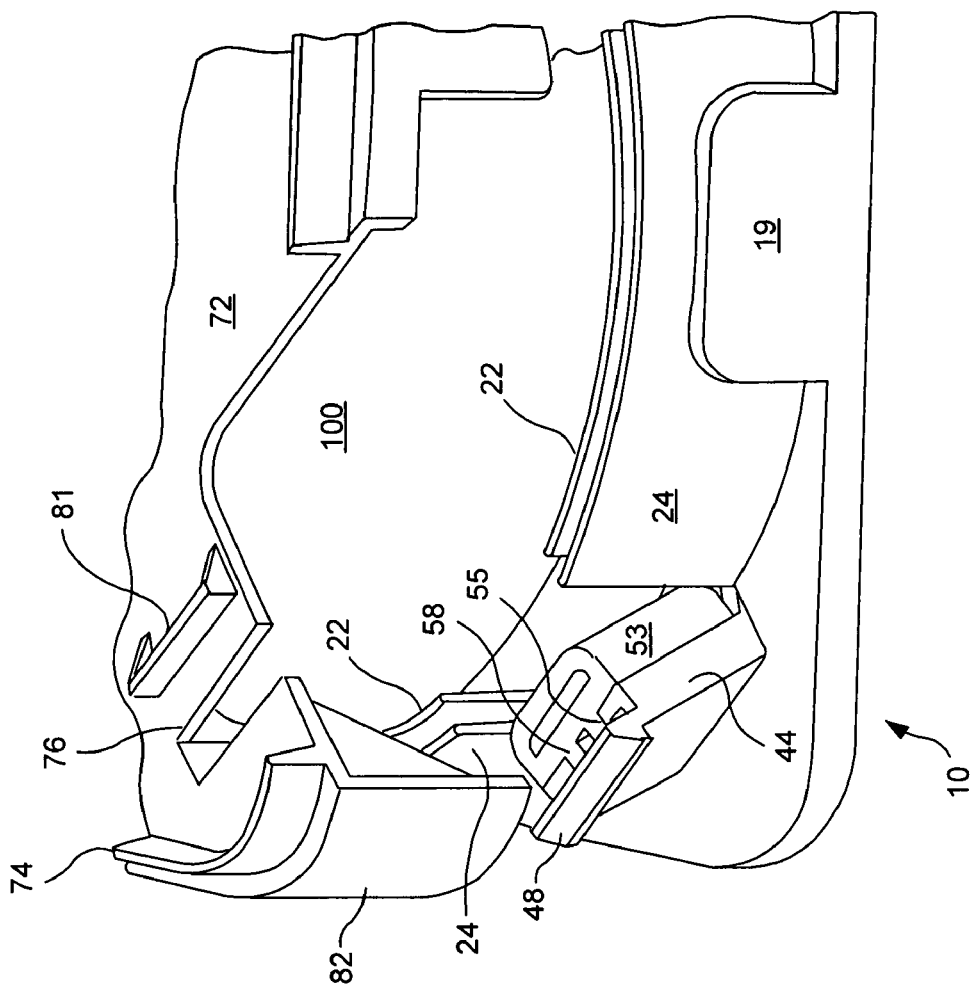
FIG. 21 is a perspective, partially cut-away, view of the lid of the semiconductor wafer containment device free of engagement with pivoting latch element the base so that the pivoting latch element pivots outwardly thereby moving the spacer element away from the semiconductor wafers.
Figure 20:
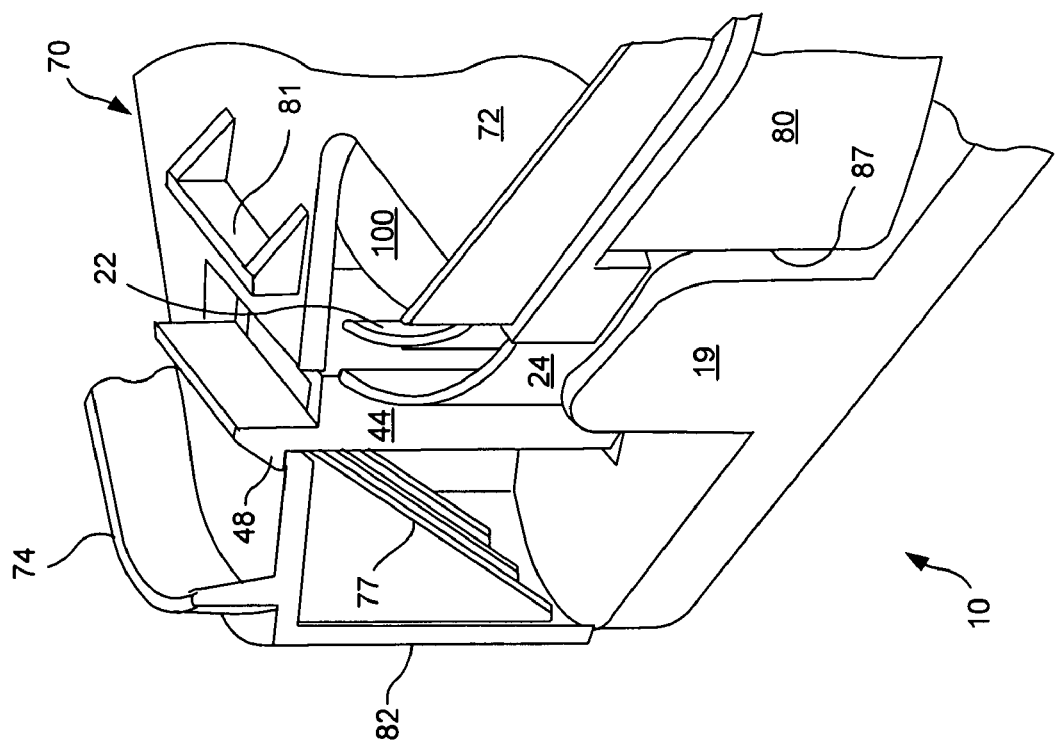
FIG. 20 is a perspective, partially cut-away, view of the lid of the semiconductor wafer containment device engaging the pivoting latch element so that the pivoting latch element is in its upright position and the spacer element is urged against the semiconductor wafers.
Figure 22:
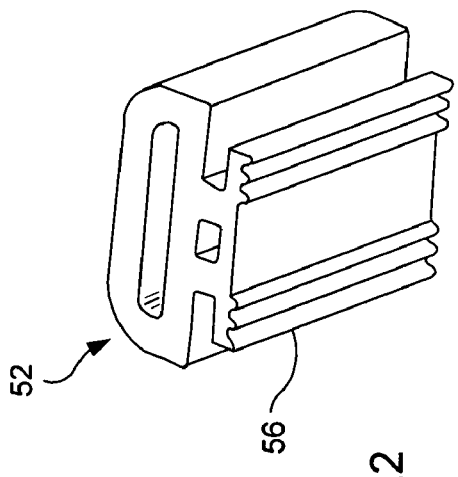
FIG. 22 is a perspective view of the spacer element.

To use the wafer containment box of the present invention, the user would typically start with an empty base 10 (that is, with no semiconductor wafers 100 in wafer containment space 40), with pivoting latch elements 44, 46 in their outward positions. The user would then manually or with automated equipment, place semiconductor wafers 100 into wafer containment space 40 and place lid 70 over base 10 so as to capture pivoting latch elements 44, 46 and urge them to an upright detent position with extruded padded spacer elements 52, 53 impinging against semiconductor wafers 100 as shown in the sequence from FIGS. 18-20 and as described above. The wafer containment box is then typically transported. Lid 70 may be removed manually by squeezing the pivoting latch elements 44, 46 toward the finger gripping elements 81, 83 to release the pivoting latch elements 44, 46 from lid 70 thereby allowing the pivoting latch elements 44, 46 to pivot to an outward position (such as shown in FIG. 21) thereby allowing easy access to the semiconductor wafers 100.

Thus the several aforementioned objects and advantages are most effectively attained. Although a single preferred embodiment of the invention has been disclosed and described in detail herein, it should be understood that this invention is in no sense limited thereby and its scope is to be determined by that of the appended claims.

What is claimed is:

1. A containment device for semiconductor wafers, comprising:

a base including at least one cylindrical wall extending therefrom, said at least one cylindrical wall forming a wafer containment space therewithin, said at least one cylindrical wall including slots through which latch elements pivot radially, and a lid which includes means for capturing said latch elements in an outwardly pivoted position and urging said latch elements to a radially inward position so as to engage semiconductor wafers within said wafer containment space, said latch elements thereby detent engaging said lid, said lid forming a top of the containment device when said base and said lid are detent engaged together.

2. The containment device for semiconductor wafers of claim 1 wherein said at least one cylindrical wall extends perpendicularly from said base.

3. The containment device for semiconductor wafers of claim 2 wherein said latch elements pivot between an outward position which is substantially away from said wafer containment space and an inward upright position which impinges said wafer containment space.

4. The containment device for semiconductor wafers of claim 3 wherein said means for capturing and urging includes ramps formed from an exterior portion of said lid to slots formed inwardly adjacent from said exterior portion, wherein said ramps capture said latch elements in said outward position and said slots detent engage said latch elements in said upright position.

5. The containment device for semiconductor wafers of claim 4 wherein said latch elements include an exterior relatively rigid portion and an interior spacer element, said interior spacer element for impinging into said wafer containment space.

6. The containment device for semiconductor wafers of claim 5 wherein said relatively rigid portion includes a groove and said interior spacer element includes a flange for engaging said groove.

7. The containment device for semiconductor wafers of claim 6 wherein said pivoting latch elements include a first arm and a second arm at an obtuse angle to each other, wherein said first arm includes an element for detent engaging said lid and said second arm includes a pivot axis.

8. The containment device for semiconductor wafers of claim 7 wherein said second arm travels within a pocket in said base.

9. The containment device for semiconductor wafers of claim 1 wherein said lid includes a lid cylindrical wall which, when said base and said lid are detent engaged together, fits immediately outwardly adjacent from said at least one cylindrical wall of said base.

10. The containment device for semiconductor wafers of claim 9 wherein male aligning elements are formed outward of said at least one cylindrical wall and female aligning elements are formed on said lid cylindrical wall, whereby said male aligning elements and said female aligning elements engage when said base and said lid are detent engaged together.

11. A containment device for semiconductor wafers, comprising:

a base including an inner concentric cylindrical wall and an outer concentric cylindrical wall extending therefrom, said inner cylindrical wall forming a wafer containment space therewithin, said inner and outer concentric cylindrical walls including slots through which latch elements pivot radially; and a lid which includes means for capturing said latch elements in an outwardly pivoted position and urging said latch elements to a radially inward position so as to engage semiconductor wafers within said wafer containment space, said latch elements thereby detent engaging said lid, said lid forming a top of the containment device when said base and said lid are detent engaged together.

12. The containment device for semiconductor wafers of claim 11 wherein said inner and outer concentric cylindrical walls extend perpendicularly from said base.

13. The containment device for semiconductor wafers of claim 12 wherein said latch elements pivot between an outward position which is substantially away from said wafer containment space and an inward upright position which impinges said wafer containment space.

14. The containment device for semiconductor wafers of claim 13 wherein said means for capturing and urging includes ramps formed from an exterior portion of said lid to slots formed inwardly adjacent from said exterior portion, wherein said ramps capture said latch elements in said outward position and said slots detent engage said latch elements in said upright position.

15. The containment device for semiconductor wafers of claim 14 wherein said latch elements include an exterior relatively rigid portion and an interior spacer element, said interior spacer for impinging into said wafer containment space.

16. The containment device for semiconductor wafers of claim 15 wherein said relatively rigid portion includes a groove and said interior spacer element includes a flange for engaging said groove.

17. The containment device for semiconductor wafers of claim 16 wherein said pivoting latch elements include a first arm and a second arm at an obtuse angle to each other, wherein said first arm includes an element for detent engaging said lid and said second arm includes a pivot axis.

18. The containment device for semiconductor wafers of claim 17 wherein said second arm travels within a pocket in said base.

19. The containment device for semiconductor wafers of claim 11 wherein said lid includes a lid cylindrical wall which, when said base and said lid are detent engaged together, fits immediately outwardly adjacent from said outer concentric cylindrical wall of said base.

20. The containment device for semiconductor wafers of claim 19 wherein male aligning elements are formed outward of said outer concentric cylindrical wall and female aligning elements are formed on said lid cylindrical wall, whereby said male aligning elements and said female aligning elements engage when said base and said lid are detent engaged together.

* * * * *